(12) United States Patent
Kanno et al.

(10) Patent No.: US 9,686,868 B2
(45) Date of Patent: Jun. 20, 2017

(54) METHOD OF REMOVING SOLUBLE MATERIAL LAYER BY DISSOLVING, METHOD OF MANUFACTURING MEMBER, SOCKET FOR USE IN ELECTRONIC PART, AND ELECTRIC AND ELECTRONIC DEVICES

(71) Applicant: ALPS ELECTRIC CO., LTD., Tokyo (JP)

(72) Inventors: Hiroyuki Kanno, Miyagi-ken (JP); Masahiro Koike, Miyagi-ken (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 15/154,354

(22) Filed: May 13, 2016

(65) Prior Publication Data

US 2016/0338208 A1    Nov. 17, 2016

(30) Foreign Application Priority Data

May 15, 2015    (JP) ................. 2015-100518

(51) Int. Cl.
*H05K 3/22* (2006.01)
*H05K 1/02* (2006.01)
*C23C 18/16* (2006.01)
*C23C 18/32* (2006.01)

(52) U.S. Cl.
CPC ........... *H05K 3/22* (2013.01); *C23C 18/1651* (2013.01); *C23C 18/1689* (2013.01); *H05K 1/0216* (2013.01); *C23C 18/32* (2013.01); *H05K 2201/0715* (2013.01); *H05K 2203/0703* (2013.01); *H05K 2203/0756* (2013.01)

(58) Field of Classification Search
CPC .... H05K 3/22; H05K 1/0216; C23C 18/1651; C23C 18/1689
See application file for complete search history.

(56) References Cited

U.S. PATENT DOCUMENTS

| 7,989,271 B2 * | 8/2011 | Nam ...................... B82Y 10/00 438/149 |
| 8,840,795 B2 * | 9/2014 | Jeong ................. B29C 33/3878 216/11 |
| 2007/0042585 A1 | 2/2007 | Sakai et al. |

FOREIGN PATENT DOCUMENTS

JP    2010-031306    2/2010

* cited by examiner

*Primary Examiner* — Duy Deo
(74) *Attorney, Agent, or Firm* — Brinks Gilson & Lione

(57) ABSTRACT

A concave part defined by a ring-shaped step is formed on the upper surface of a housing body. A first elastic member is brought into contact with a portion of an electroless nickel-plated layer, the portion being in a region inside the concave part. The first elastic member is then pressed and deformed so that the whole of an angular portion, at which the upper surface of the ring-shaped step and its side surface cross, bites into the first elastic member and that the first elastic member and the electroless nickel-plated layer on the upper surface of the ring-shaped step are separated from each other. The housing body is then immersed in a dissolving liquid that can dissolve the electroless nickel-plated layer while the first elastic member is kept deformed.

5 Claims, 7 Drawing Sheets

"METHOD OF REMOVING SOLUBLE
MATERIAL LAYER BY DISSOLVING,
METHOD OF MANUFACTURING MEMBER,
SOCKET FOR USE IN ELECTRONIC PART,
AND ELECTRIC AND ELECTRONIC
DEVICES

CLAIM OF PRIORITY

This application claims benefit of priority to Japanese Patent Application No. 2015-100518 filed on May 15, 2015, which is hereby incorporated by reference in its entirety.

BACKGROUND

1. Field of the Disclosure

The present disclosure relates to a method of removing a soluble material layer formed on a surface of a base material by dissolving the soluble material layer.

2. Description of the Related Art

As a method of plating on a resin base material, a treatment method is known that includes a step of performing etching treatment on a surface of a resin base material, a step of performing catalyst adsorption treatment by which a metal catalyst is adsorbed to the treated surface after the etching treatment, a step of performing electroless plating treatment on the treated surface after the catalyst adsorption treatment, and a step of performing metal plating treatment on the treated surface after the electroless plating treatment (see Japanese Unexamined Patent Application Publication No. 2010-031306, for example).

For example, when an integrated circuit (IC) chip is mounted on a printed circuit board, an IC socket or another connector is used. To suppress cross talk noise and the like between terminals of this type of IC socket, metal-plated layers are formed on surfaces of a housing made of a synthetic resin to have an electromagnetic shield function. With this type of housing, places at which a metal-plated layer is formed are restricted to prevent a short-circuit and other problems. To form a metal-plated layer at desired places, therefore, a metal-plated layer is formed in a wide range on a housing surface, after which etching treatment is performed to remove unnecessary portions by dissolving them.

In the above etching treatment, a portion at which a metal-plated layer is needed is protected (masked) by pressing, for example, an elastic member such as a silicone rubber against the portion. Unnecessary portions, which are not protected, are removed by dissolved them with an etching liquid. However, the metal-plated layer may not be adequately removed on a boundary between a portion at which a metal-plated layer is needed and a portion at which a metal-plated layer is not needed. This has been problematic in precision with which a metal-plated layer is formed.

SUMMARY

A method is provided for removing a soluble material layer formed on surfaces of a base material by dissolving the soluble material layer. In the method, a surface of the base material has concave parts, each of which is defined by a ring-shaped step that follows the outer edges of a region on which to form the soluble material layer, the soluble material layer being formed in the concave parts and the upper surfaces of the ring-shaped steps; an elastic member is brought into contact with a portion of the soluble material layer, the portion being in the region, after which the elastic member is pressed and deformed so that the whole of an angular portion, at which the upper surface of the ring-shaped step and its side surface cross, bites into the elastic member and that the elastic member and the soluble material layer on the upper surface of the ring-shaped step are separated from each other, and the base material is then immersed in a liquid that can dissolve the soluble material layer while the elastic member is kept deformed.

In the above method of removing a soluble material layer by dissolving it, since the whole of the angular portion at the ring-shaped step bites into the elastic member, the upper surface of the ring-shaped step can be exposed in a state in which a portion, on a surface of the base material, on which to form the soluble material layer is sealed. Therefore, when the base material is immersed into the liquid, the soluble material layer on the upper surface of the ring-shaped step can be dissolved while suppressing the liquid from entering the inside of the ring-shaped step.

Figure 1:
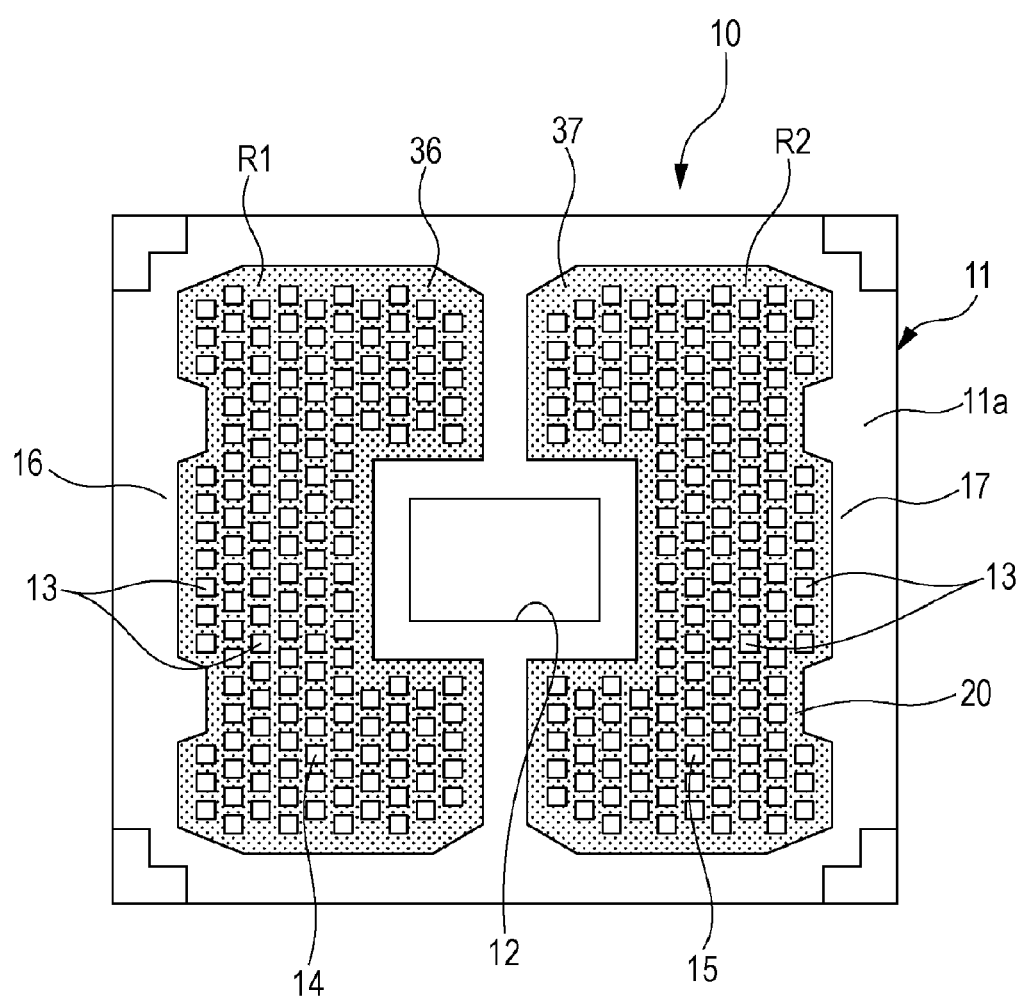
FIG. 1 is a plan view of a connector housing manufactured by using a method, in an embodiment of the present invention, of removing a soluble material layer by dissolving it.

DESCRIPTION OF THE EXEMPLARY
EMBODIMENTS

Embodiments of the present invention will be described below with reference to the drawings. In the descriptions below, like elements will be denoted by like reference characters and repeated descriptions of members will be appropriately omitted. Descriptions indicating "up", "down", "left", and "right" are used for the sake of convenience to explain relative positional relationships among members and do not indicate absolute positional relationships.

Figure 2:
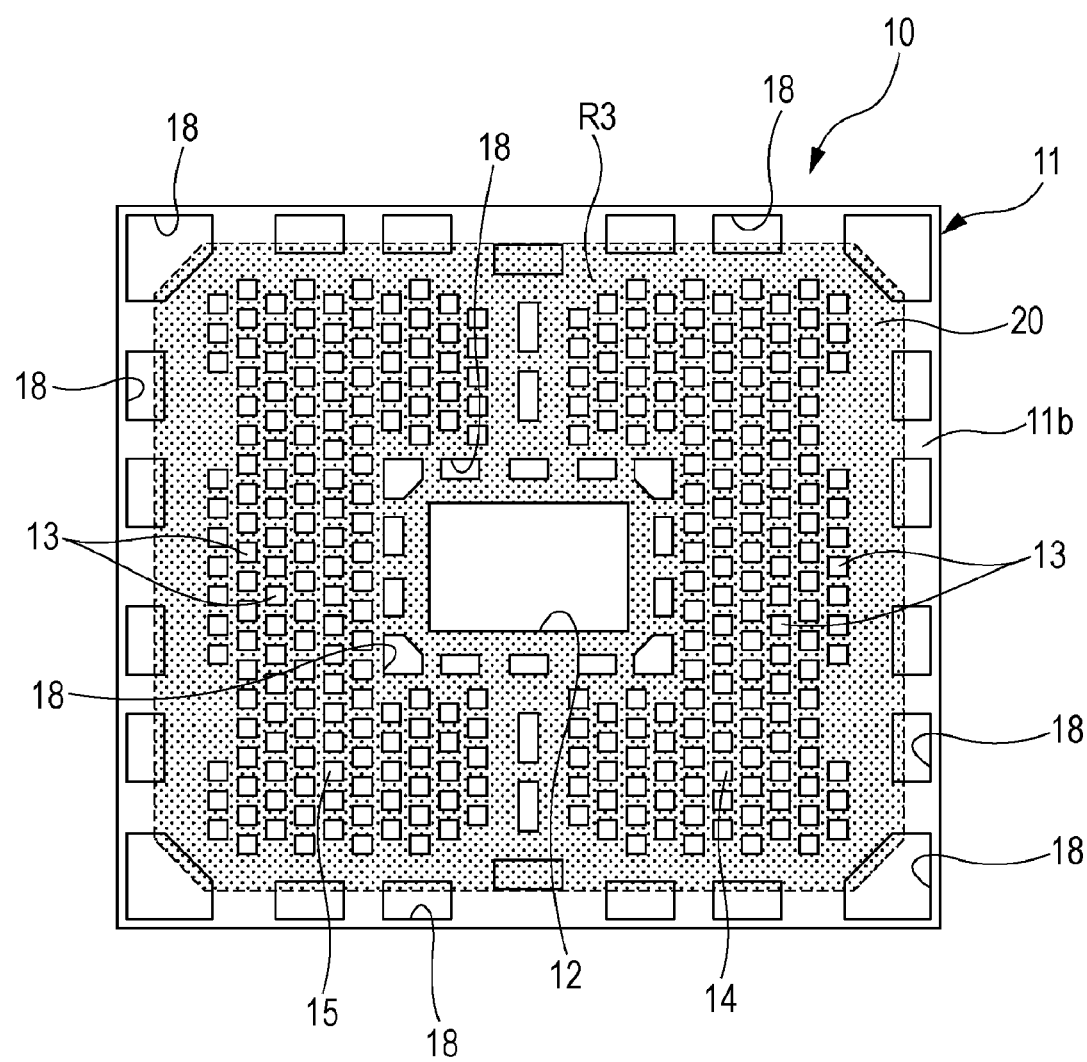
FIG. 2 is a bottom view of the connector housing in FIG. 1.
Figure 3:
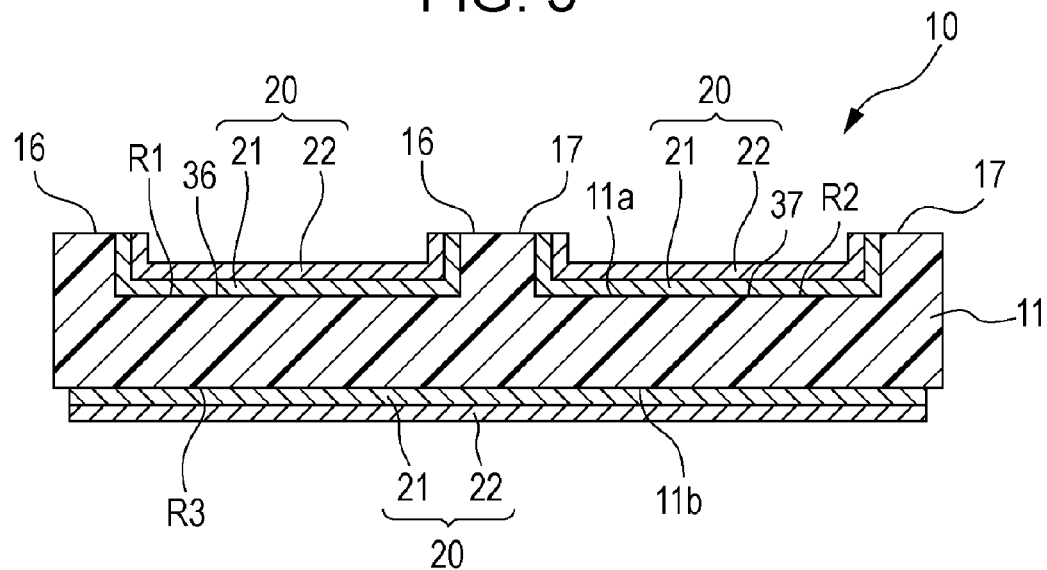
FIG. 3 is a schematic cross-sectional view of the connector housing in FIG. 1.

FIG. 1 is a plan view of a connector housing manufactured by using a method, in an embodiment of the present invention, of removing a soluble material layer by dissolving it. FIG. 2 is a bottom view of the connector housing in FIG. 1. FIG. 3 is a schematic cross-sectional view of the connector housing in FIG. 1.

As illustrated in FIGS. 1 and 2, a connector housing 10 has a housing body 11 made of a synthetic resin in a flat-plate shape that is square in a plan view, and a plated layer 20 is formed on the housing body 11.

An opening 12, which is rectangular, is formed at the center of the housing body 11 so as to extend from its upper surface 11a to its lower surface 11b. Many terminal through-holes 13 are formed so as to enclose the opening 12. The many terminal through-holes 13 form two insertion hole groups denoted 14 and 15, which are separated into the left side and right side on the drawing. Concave parts 36 and 37 are formed on the upper surface 11a of the housing body 11; the concave part 36 is defined by a ring-shaped step 16 that encloses the insertion hole group 14 and the concave part 37 is defined by a ring-shaped step 17 that encloses the insertion hole group 15. Protrusions used to position an IC chip to be mounted on the upper surface 11a are formed at the four corners of the upper surface 11a of the housing body 11. A plurality of lightening holes 18 are formed in the lower surface 11b of the housing body 11.

As illustrated in FIG. 3, the plated layer 20 includes a first plated layer 21, which is an electroless nickel-plated layer laid on a surface of the housing body 11, and a second plated layer 22, which is an electroless plated layer laid on the first plated layer 21.

Specifically, the plated layer 20 is formed in regions R1 and R2 on the upper surface 11a of the housing body 11, which are respectively inside the concave part 36 defined by the ring-shaped step 16 and the concave part 37 defined by the ring-shaped step 17, in a predetermined region R3 on the lower surface 11b of the housing body 11, the many terminal through-holes 13 being included inside the region R3, and on the inner circumferential surfaces of the many terminal through-holes 13. That is, the regions R1, R2, and R3 are regions in which to form the plated layer 20. FIGS. 3 to 8 only schematically illustrate a cross-section; the many terminal through-holes 13 are not illustrated.

Next, steps to form the plated layer 20 on surfaces of the housing body 11 will be described with reference to FIGS. 4 to 8.

Figure 4:
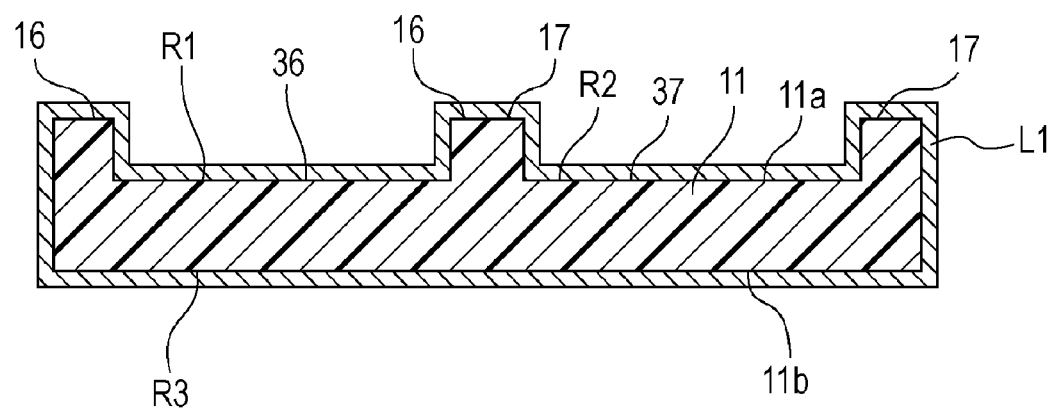
FIG. 4 is a schematic cross-sectional view illustrating a state in which an electroless nickel-plated layer is formed on the surfaces of a housing body.
Figure 5:
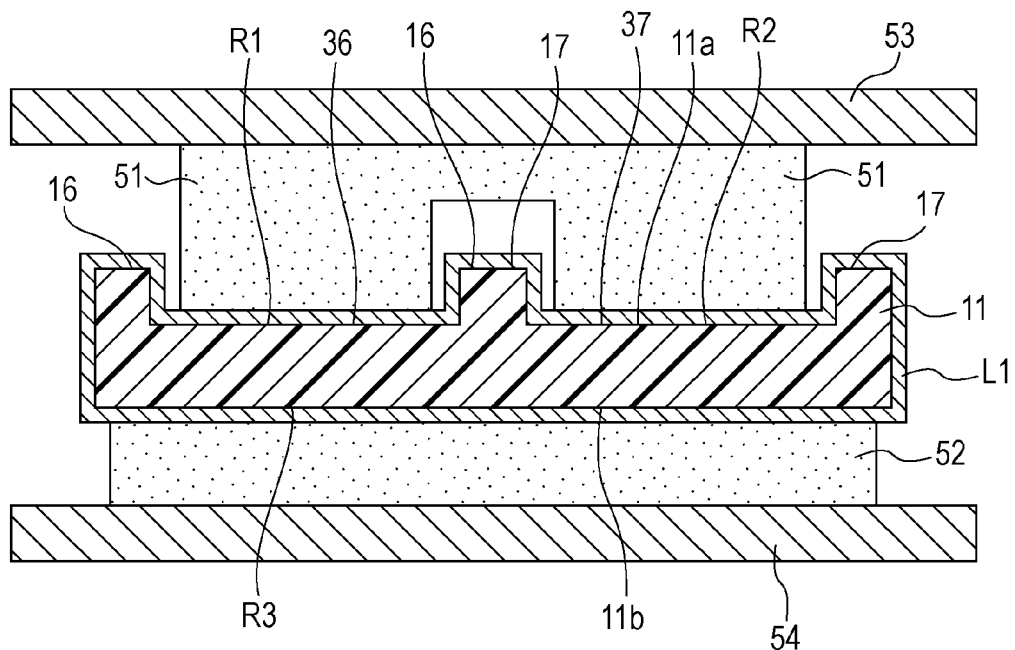
FIG. 5 is a schematic cross-sectional view illustrating a state in which elastic members are in contact with the electroless nickel-plated layer formed on the surfaces of the housing body.
Figure 6:
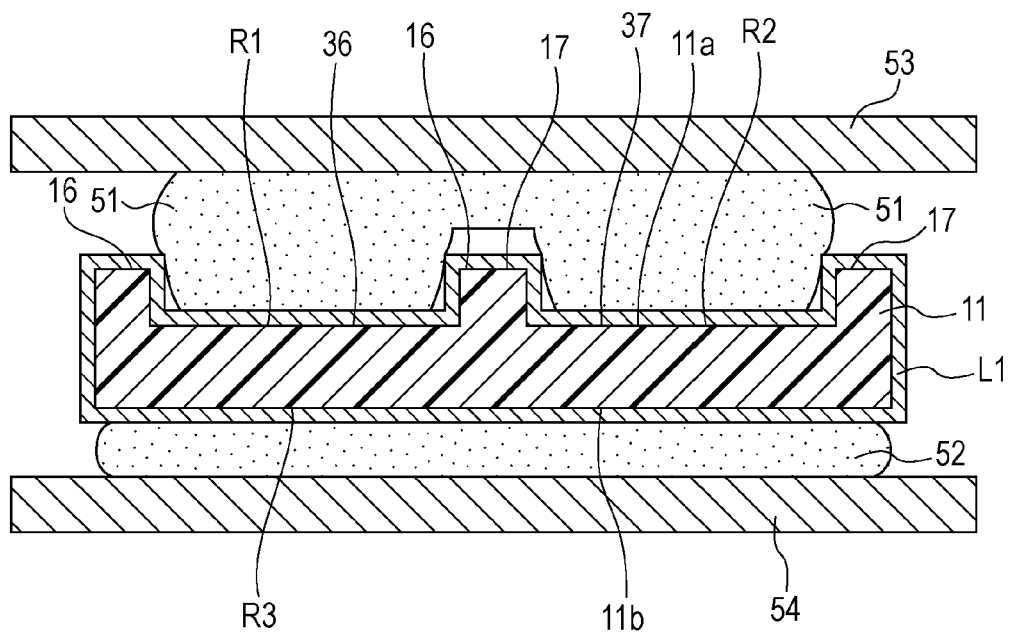
FIG. 6 is a schematic cross-sectional view illustrating a state in which the elastic members are pressed against the electroless nickel-plated layer.
Figure 7:
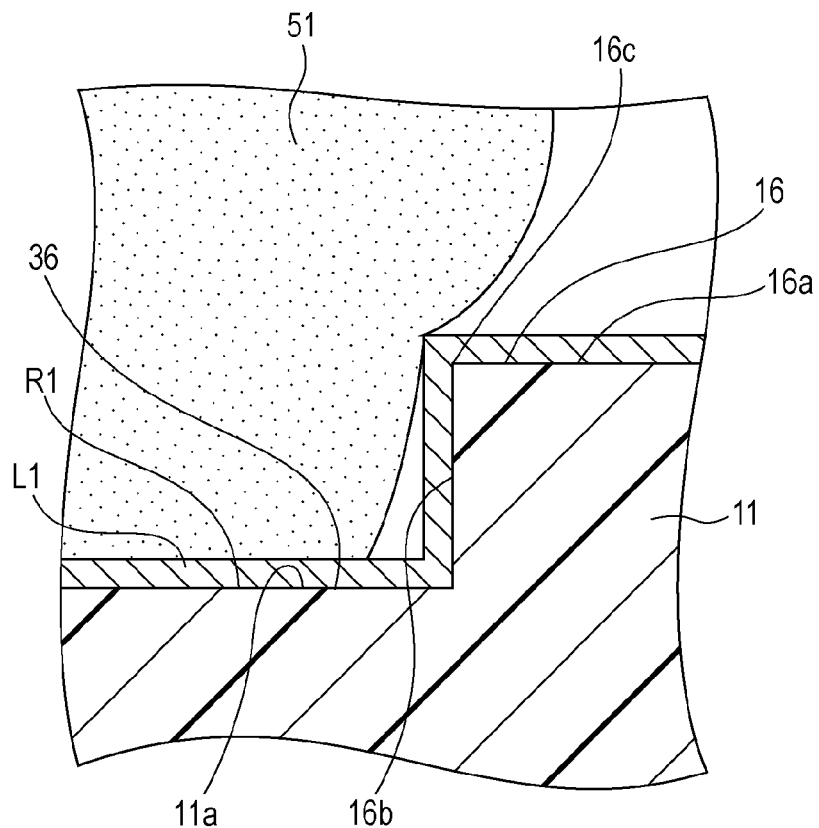
FIG. 7 is an enlarged cross-sectional view illustrating the vicinity of a ring-shaped protrusion in FIG. 6.
Figure 8:
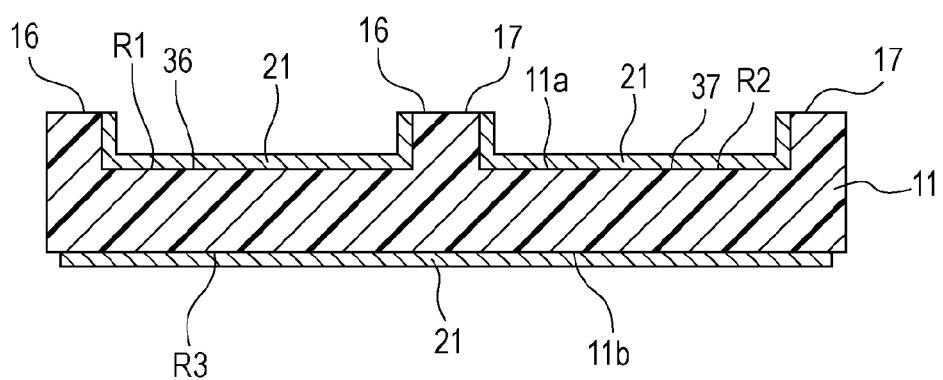
FIG. 8 is a schematic cross-sectional view illustrating a state in which a first plated layer is formed on surfaces of the housing surface.

FIG. 4 is a schematic cross-sectional view illustrating a state in which an electroless nickel-plated layer is formed on the surfaces of a housing body. FIG. 5 is a schematic cross-sectional view illustrating a state in which elastic members are in contact with the electroless nickel-plated layer formed on the surfaces of the housing body. FIG. 6 is a schematic cross-sectional view illustrating a state in which the elastic members are pressed against the electroless nickel-plated layer. FIG. 7 is an enlarged cross-sectional view illustrating the vicinity of a ring-shaped protrusion in FIG. 6. FIG. 8 is a schematic cross-sectional view illustrating a state in which a first plated layer is formed on surfaces of the housing surface.

First, an electroless nickel-plated layer L1 is formed on all surfaces including the upper surface 11a and lower surface 11b of the housing body 11 and the internal circumferential surfaces of the many terminal through-holes 13. Specifically, the surfaces of the housing body 11 are degreased, after which the housing body 11 is immersed in an etching liquid to make the surfaces of the housing body 11 coarse. A catalyst such as a palladium catalyst is then made to adhere to the surfaces of the housing body 11, after which the housing body 11 is immersed in an electroless nickel plating liquid, forming the electroless nickel-plated layer L1 as illustrated in FIG. 4. Specifically, as the soluble material layer, the electroless nickel-plated layer L1 is formed in the region R1 in the concave part 36, in the region R2 in the concave part 37, and on the upper surfaces of the ring-shaped steps 16 and 17.

Next, unnecessary portions of the electroless nickel-plated layer L1 are removed by dissolving them, forming the first plated layer 21. Specifically, as illustrated in FIG. 5, a first elastic member 51 is brought into contact with portions of the electroless nickel-plated layer L1 that are formed in the regions R1 and R2 on the upper surface 11a of the housing body 11, and a second elastic member 52 is brought into contact with the electroless nickel-plated layer L1 formed in the region R3 on the lower surface 11b of the housing body 11. The first elastic member 51 and second elastic member 52 are then sandwiched between a pair of plate members 53 and 54, which are made of a metal. A portion of the first elastic member 51 that is brought into contact with the region R1 and a portion of the first elastic member 51 that is brought into contact with the region R2 are respectively slightly smaller than the regions R1 and R2 in a plan view. A spacing (0.1 mm, for example) is thereby left between the first elastic member 51 and the ring-shaped step 16 around its circumference and between the first elastic member 51 and the ring-shaped step 17 around its circumference. The first elastic member 51 preferably has a higher hardness than the second elastic member 52; in this embodiment, the hardness of the first elastic member 51 is 50 and the hardness of the second elastic member 52 is 30.

Next, the plate member 53 is relatively pressed toward the plate member 54 to deform the first elastic member 51 and second elastic member 52. Specifically, as illustrated in FIG. 6, the interval between the plate members 53 and 54 is reduced to contract the first elastic member 51 and second elastic member 52 in the up-and-down directions on the drawing and bring the first elastic member 51 and second elastic member 52 in tight contact with the electroless nickel-plated layer L1 formed in the regions R1, R2, and R3.

At that time, as illustrated in FIG. 7, the first elastic member 51 is pressed and deformed so that the first elastic member 51 is contracted in the region R1 in the up-and-down directions on the drawing and is thereby expanded in the right-and-left directions on the drawing and the whole of an angular portion 16c, at which the upper surface 16a of the ring-shaped step 16 and its side surface 16b cross, bites into the first elastic member 51 with the electroless nickel-plated layer L1 intervening therebetween and that the first elastic member 51 and the electroless nickel-plated layer L1 on the upper surface 16a of the ring-shaped step 16 are separated from each other. Thus, a portion inside the angular portion 16c of the ring-shaped step 16, that is, the region R1 in the concave part 36, is sealed by the first elastic member 51 and the electroless nickel-plated layer L1 on the upper surface 16a of the ring-shaped step 16 is exposed. This is also true in the region R2. The second elastic member 52 is also deformed so as to be contracted in the up-and-down directions on the drawing and is pressed against the region R3.

The housing body 11 is then immersed in a dissolving liquid that can dissolve the electroless nickel-plated layer L1 while the first elastic member 51 and second elastic member 52 are kept deformed. Accordingly, the exposed portion of the electroless nickel-plated layer L1 is removed by dissolving the exposed portion with the dissolving liquid, and the first plated layer 21 is formed in the regions R1, R2, and R3 as illustrated in FIG. 8.

Finally, the housing body 11 is immersed into an electroless plating liquid to form the second plated layer 22, which is an electroless plated layer, on the first plated layer 21, completing the connector housing 10 illustrated in FIG. 3.

In the embodiment described above, the first elastic member 51 is brought into contact with a portion of the electroless nickel-plated layer L1, the portion being in the region R1 in the concave part 36, after which the first elastic member 51 is pressed and deformed so that the whole of the angular portion 16c, at which the upper surface 16a of the ring-shaped step 16 and its side surface 16b cross, bites into the first elastic member 51 and that the first elastic member 51 and the electroless nickel-plated layer L1 on the upper surface 16a of the ring-shaped step 16 are separated from each other. The housing body 11 is then immersed in a dissolving liquid that can dissolve the electroless nickel-plated layer L1 while the first elastic member 51 is kept deformed. Accordingly, since the whole of the angular portion 16c of the ring-shaped step 16 bites into the first elastic member 51, the upper surface 16a of the ring-shaped step 16 can be exposed with the region R1 sealed. Therefore, when the housing body 11 is immersed in a dissolving liquid, the electroless nickel-plated layer L1 on the upper surface 16a of the ring-shaped step 16 can be dissolved while suppressing the dissolving liquid from entering the inside of the ring-shaped step 16, that is, the region R1 in the concave part 36. This is also true in the region R2.

The first elastic member 51 is preferably deformed by being relatively pressed toward the second elastic member 52, which has a different hardness from the first elastic member 51, in a state in which the housing body 11 on which the electroless nickel-plated layer L1 has been formed is sandwiched between the first elastic member 51 and the second elastic member 52. Thus, the first elastic member 51 can be precisely deformed when compared with a structure in which the first elastic member 51 and second elastic member 52 have the same hardness.

The first elastic member 51 preferably has a higher hardness than the second elastic member 52. In a case in which, for example, the electroless nickel-plated layer L1 is formed on a portion as well, on a surface of the housing body 11, with which the second elastic member 52 is brought into contact, if the first elastic member 51 has a lower hardness than the second elastic member 52, the first elastic member 51 is more greatly deformed than the second elastic member 52 and the pressing force is absorbed. In this case, the second elastic member 52 cannot be adequately brought into tight contact with a surface of the housing body 11, so the dissolving liquid may enter a clearance between the second elastic member 52 and the surface of the housing body 11. This may dissolve the electroless nickel-plated layer L1 more than necessary. In view of this problem, the first elastic member 51 has a higher hardness than the second elastic member 52, so it is possible to suppress the first elastic member 51 from being more greatly deformed than the second elastic member 52.

As described above, in this embodiment, the electroless nickel-plated layer L1 formed on a surface of the housing body 11 can be precisely removed by dissolving the electroless nickel-plated layer L1.

When the method, described above, of removing a soluble material layer by dissolving it is included, a member can be manufactured that has a base material (housing body 11) and a soluble material layer formed on part of the surfaces of the base material. A method of manufacturing the member includes a step of forming a soluble material layer on surfaces of the base material and a step of partially removing the soluble material layer, the step including the method, described above, of removing a soluble material layer by dissolving it.

With the member manufactured by the above manufacturing method, a soluble material layer is appropriately formed on the base material, so the member can be preferably used as a member of a socket for use in an electronic part. That is, the socket, in an embodiment of the present invention, for use in an electronic part has the member manufactured by the manufacturing method described above. Electric devices and electronic devices in an embodiment of the present invention have the above socket for use in an electronic part.

So far, an embodiment of the present invention and its application examples have been described. However, the present invention is not limited to these examples. For example, the scope of the present invention includes embodiments obtained as a result of making additions or deletions of constituent element to or from the above embodiment and its application examples, performing design changes to the above embodiment and its application examples, or combining features of these embodiments; the additions or deletions, the design changes, or the combination is appropriately effected by a person having ordinary skill in the art without departing from the intended scope of the invention.

For example, the soluble material layer formed in the regions R1, R2, and R3 has been described as an electroless nickel-plated layer, but this is not a limitation. Another plated layer may be formed. Alternatively, a layer may be formed in a dry process such as sputtering or deposition or may be formed by printing or the like.

EXAMPLES

The present invention will be further specifically described by using examples. However, the scope of the present invention is not limited to these examples and the like.

First Example

The electroless nickel-plated layer L1 was formed on all surfaces of the housing body 11 and was sandwiched between the first elastic member 51 and the second elastic member 52. The housing body 11 was then immersed in a dissolving liquid in a state in which the housing body 11 was pressed with a force of 7.35 N to form the first plated layer 21 on the upper surface 11a and lower surface 11b of the housing body 11. In the first example, the thickness of the electroless nickel-plated layer L1 was 0.811 µm, the hardness of the first elastic member 51 was 50, and the hardness of the second elastic member 52 was also 50.

Second Example

In the second example, the thickness of the electroless nickel-plated layer L1 was 1.002 µm, the hardness of the first elastic member 51 was 50, and the hardness of the second elastic member 52 was 30. Other respects were the same as in the first example.

First Comparative Example

In the first comparative example, the upper surface 11a of the housing body 11 was a flat surface without forming the ring-shaped steps 16 and 17 of the housing body 11. The shapes of portions of the first elastic member 51 that are brought into contact with the regions R1 and R2 were respectively the same as the shapes of the regions R1 and R2 in a plan view. The thickness of the electroless nickel-plated layer L1 was 0.849 μm. Other respects were the same as in the first example.

Second Comparative Example

In the second comparative example, the thickness of the electroless nickel-plated layer L1 was 1.240 μm. Other respects were the same as in the first comparative example.

Figure 9:
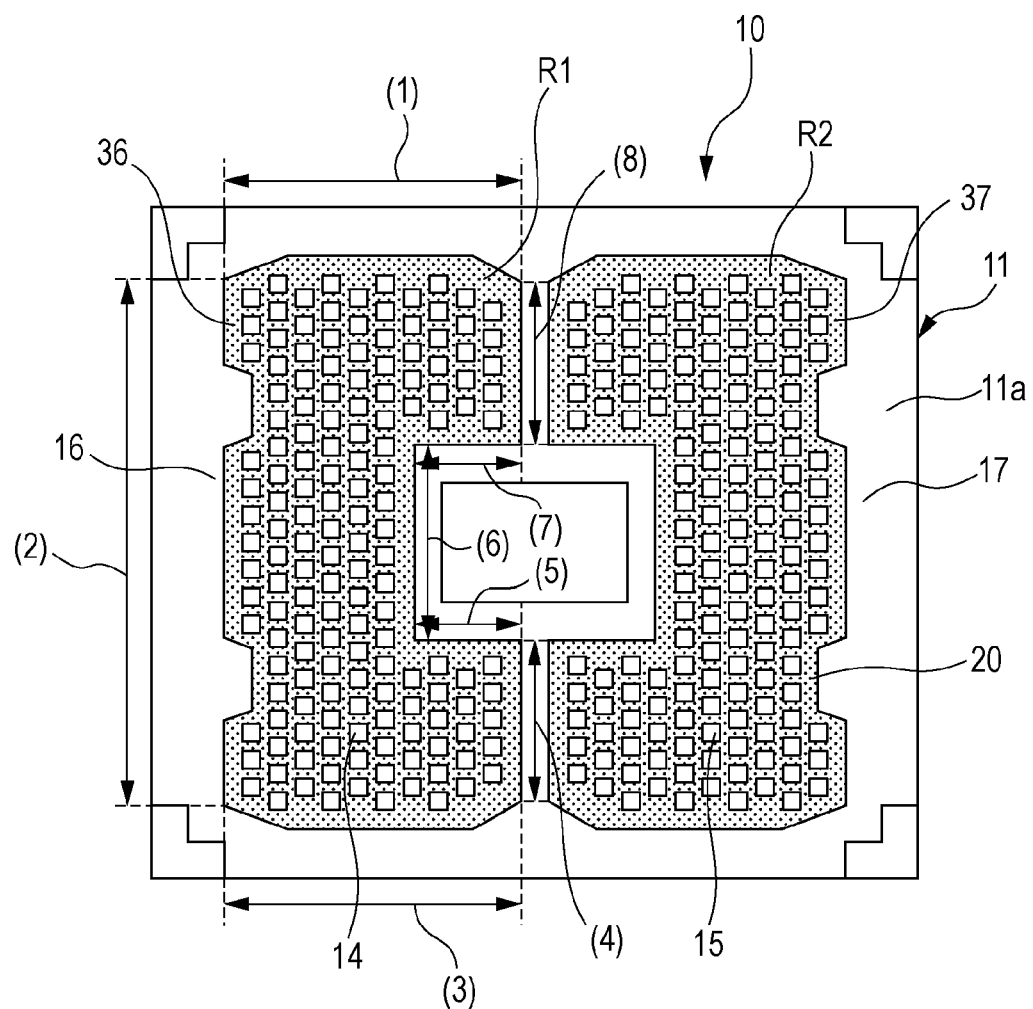
FIG. 9 is a plan view indicating portions at which an amount by which the first plated layer protrudes on the upper surface of the housing body is calculated.
Figure 10:
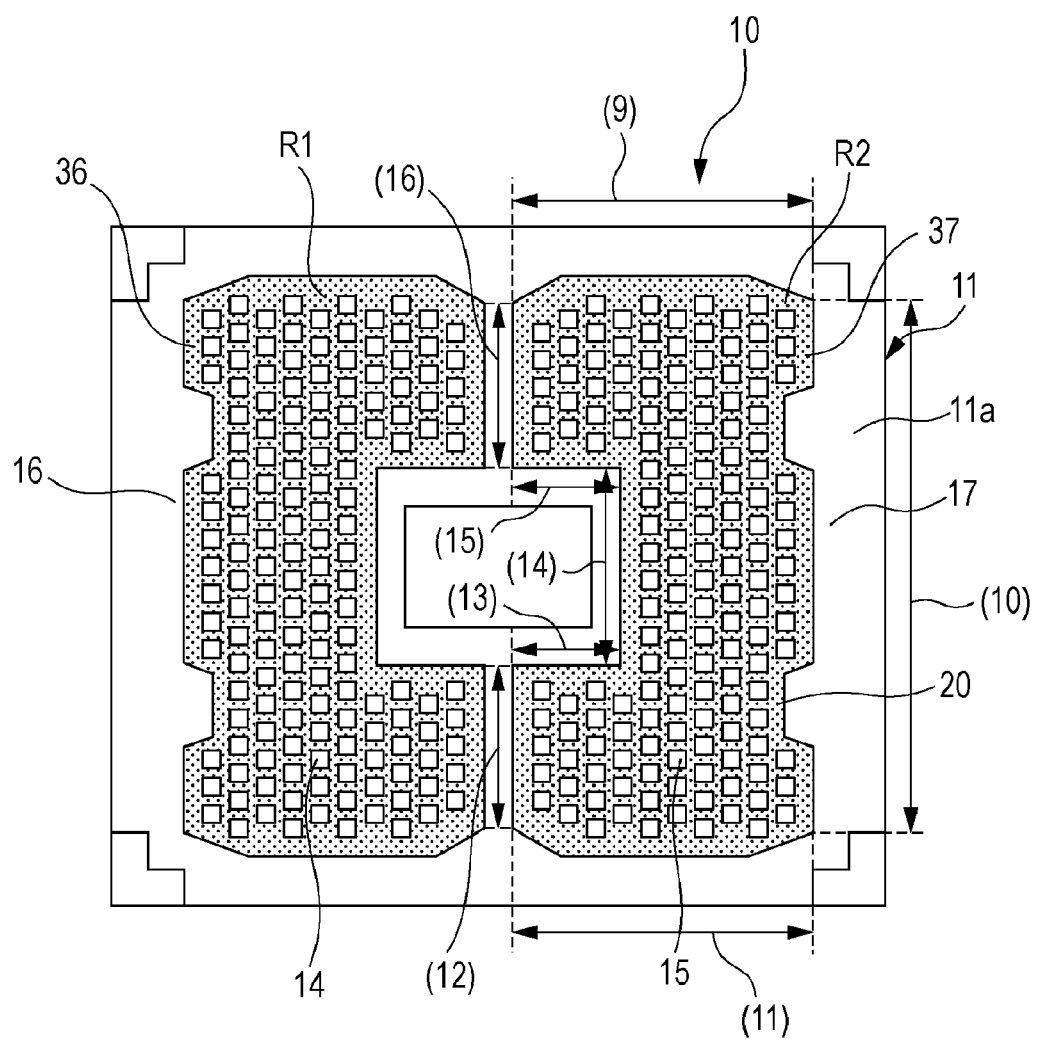
FIG. 10 is another plan view indicating portions at which an amount by which the first plated layer protrudes on the upper surface of the housing body is calculated.

An amount by which the first plated layer 21 protrudes from an outer edge of the region R1 at portions (1) to (8) indicated in FIG. 9 and from an outer edge of the region R2 at portions (9) to (16) in FIG. 10 was measured. Evaluations were made according to criteria described below.

A: There was no portion at which the amount of protrusion exceeded 0.10 mm.

B: There were one or more portions at which the amount of protrusion exceeded 0.10 mm but there was no portion at which the amount of protrusion exceeded 0.15 mm.

C: A plating film below an elastic member was dissolved.

Conditions in the first and second examples and the first and second comparative examples are indicated in Table 1. Tables 2 and 3 indicate measurement results of the amount of protrusion in the first and second examples and the first and second comparative examples (the values in Tables 2 and 3 are indicated in mm). Table 4 indicates evaluation results.

TABLE 1

| | Hardness of first elastic member/hardness of second elastic member | Pressing force [N] | Thickness [μm] |
|---|---|---|---|
| First example | 50/50 | 160 | 0.811 |
| Second example | 50/30 | 140 | 1.002 |
| First comparative example | 50/50 | 160 | 0.849 |
| Second comparative example | 50/30 | 140 | 1.24 |

TABLE 2

| | (1) | (2) | (3) | (4) | (5) | (6) | (7) | (8) |
|---|---|---|---|---|---|---|---|---|
| First example | 0.04 | 0.06 | 0.02 | 0.04 | 0.01 | 0.12 | 0.06 | 0.06 |
| Second example | 0.04 | 0.07 | 0.02 | 0.05 | 0.05 | 0.05 | 0.05 | 0.05 |
| First comparative example | −0.1 | −0.15 | −0.06 | −0.04 | −0.1 | −0.09 | −0.08 | −0.06 |
| Second comparative example | −0.18 | −0.1 | −0.12 | −0.09 | −0.08 | −0.13 | −0.12 | −0.08 |

TABLE 3

| | (9) | (10) | (11) | (12) | (13) | (14) | (15) | (16) |
|---|---|---|---|---|---|---|---|---|
| First example | 0.03 | 0.09 | 0 | 0 | 0.04 | 0.07 | 0 | 0.02 |
| Second example | 0.04 | 0.06 | 0.04 | 0 | 0.03 | 0.03 | 0.03 | 0.03 |
| First comparative example | −0.1 | −0.11 | −0.12 | −0.02 | −0.06 | −0.14 | −0.12 | −0.07 |
| Second comparative example | −0.12 | −0.08 | −0.08 | −0.07 | −0.14 | −0.12 | −0.11 | −0.1 |

TABLE 4

| | Evaluation result |
|---|---|
| First example | B |
| Second example | A |
| First comparative example | C |
| Second comparative example | C |

As indicated in Tables 2 and 3, in the first example, there was one portion at which the amount of protrusion exceeded 0.10 mm but there was no portion at which the amount of protrusion exceeded 0.15 mm; in the second example, there was no portion at which the amount of protrusion exceeded 0.10 mm. In the first and second comparative examples, sealing was inadequate because steps were eliminated and a plating film below an elastic member was thereby dissolved.

From these results as well, it was clarified that, in the present invention, the electroless nickel-plated layer L1 formed on surfaces of the housing body 11 can be precisely removed by dissolving the electroless nickel-plated layer L1, particularly it was clarified that it is preferable for the first elastic member 51 has a higher hardness than the second elastic member 52.

What is claimed is:

1. A method of removing a soluble material layer formed on a surface of a base material comprising:
    dissolving the soluble material layer, wherein:
        a surface of the base material has a concave part, which is defined by a ring-shaped step that follows an outer edge of a region on which to form the soluble material layer, the soluble material layer being formed in the concave part and an upper surface of the ring-shaped steps;
        bringing an elastic member into contact with a portion of the soluble material layer, the portion being in the concave part;
        then, pressing and deforming the elastic member so that a whole of an angular portion, at which the upper surface of the ring-shaped step and a side surface of the ring-shaped step cross, bites into the elastic member and that the elastic member and the soluble material layer on the upper surface of the ring-shaped step are separated from each other; and
        then, immersing the base material in a liquid that is capable of dissolving the soluble material layer while the elastic member is kept deformed.

2. The method according to claim 1, wherein the elastic member is deformed by being relatively pressed toward another elastic member, which has a different hardness from the elastic member, in a state in which the base material is sandwiched between the elastic member and the another elastic member.

3. The method according to claim 2, wherein the elastic member has a higher hardness than the other elastic member.

4. The method according to claim 3, wherein the soluble material layer includes a plated layer.

5. A method of manufacturing a member that has a base material and a soluble material layer formed on part of a surface of the base material, the method comprising:

forming the soluble material layer on a surface of the base material; and partially removing the soluble material layer, wherein:

a surface of the base material has a concave part, which is defined by a ring-shaped step that follows an outer edge of a region on which to form the soluble material layer, the soluble material layer being formed in the concave part and an upper surface of the ring-shaped steps;

bringing an elastic member into contact with a portion of the soluble material layer, the portion being in the concave part;

then, pressing and deforming the elastic member so that a whole of an angular portion, at which the upper surface of the ring-shaped step and a side surface of the ring-shaped step cross, bites into the elastic member and that the elastic member and the soluble material layer on the upper surface of the ring-shaped step are separated from each other; and then, immersing the base material in a liquid that is capable of dissolving the soluble material layer while the elastic member is kept deformed.

\* \* \* \* \*